US012805052B2

(12) United States Patent
Mun et al.

(10) Patent No.: US 12,805,052 B2
(45) Date of Patent: Nov. 17, 2026

(54) STACKED SEMICONDUCTOR DEVICE WITH FIN CAPACITOR

(71) Applicant: OMNIVISION TECHNOLOGIES, INC., Santa Clara, CA (US)

(72) Inventors: Seong Yeol Mun, Santa Clara, CA (US); Heesoo Kang, Cupertino, CA (US); Sang Joo Lee, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 337 days.

(21) Appl. No.: 18/776,791

(22) Filed: Jul. 18, 2024

(65) Prior Publication Data

US 2026/0026127 A1 Jan. 22, 2026

(51) Int. Cl.

*H10F 39/00* (2025.01)
*H10W 90/00* (2026.01)
*H10W 90/20* (2026.01)

(52) U.S. Cl.

CPC ....... *H10F 39/811* (2025.01); *H10F 39/8027* (2025.01); *H10F 39/813* (2025.01); *H10W 90/00* (2026.01); *H10W 90/297* (2026.01)

(58) Field of Classification Search

CPC .. H10F 39/811; H10F 39/8027; H10F 39/813; H10F 39/803; H10W 90/00; H10W 90/297

See application file for complete search history.

(56) References Cited

U.S. PATENT DOCUMENTS

| | | | | |
|---|---|---|---|---|
| 8,513,723 | B2 | 8/2013 | Booth, Jr. et al. | |
| 8,841,185 | B2 | 9/2014 | Khakifirooz et al. | |
| 9,299,765 | B2 | 3/2016 | Edelstein et al. | |
| 10,103,193 | B1 | 10/2018 | Manabe et al. | |
| 10,403,659 | B2 | 9/2019 | Gambino et al. | |
| 11,765,484 | B1 | 9/2023 | Choi et al. | |
| 2003/0193058 | A1 | 10/2003 | Fried et al. | |
| 2011/0049589 | A1* | 3/2011 | Chuang | H10F 39/18 257/292 |
| 2014/0299882 | A1 | 10/2014 | Chan et al. | |
| 2019/0123088 | A1* | 4/2019 | Kwon | H10F 39/802 |
| 2020/0127034 | A1* | 4/2020 | Zhang | H10F 39/8037 |
| 2022/0084872 | A1 | 3/2022 | Mizuta | |
| 2023/0421921 | A1 | 12/2023 | Choi | |
| 2024/0038792 | A1* | 2/2024 | Cho | H04N 25/79 |

* cited by examiner

*Primary Examiner* — Andres Munoz

(74) *Attorney, Agent, or Firm* — Christensen O'Connor Johnson Kindness PLLC

(57) ABSTRACT

A stacked semiconductor device comprising a plurality of fin capacitors disposed in or on a semiconductor substrate is described. The plurality of fin capacitors is arranged to form a fin capacitor array. A fin capacitor included in the plurality of fin capacitors comprising a first electrode, a second electrode, and an insulating material. The first electrode includes a first planar portion and a plurality of first fins extending from the first planar portion. The second electrode includes a second planar portion and a plurality of second fins extending from the second planar portion. The plurality of first fins is nested with the plurality of second fins such that the plurality of first fins and the plurality of second fins are both disposed between the first planar portion and the second planar portion. The insulating material is disposed between the plurality of first fins and the plurality of second fins.

20 Claims, 8 Drawing Sheets

STACKED SEMICONDUCTOR DEVICE WITH FIN CAPACITOR

TECHNICAL FIELD

This disclosure relates generally to stacked semiconductor devices, and in particular but not exclusively, relates to stacked CMOS image sensors and applications thereof.

BACKGROUND INFORMATION

Stacked semiconductor devices are complementary metal-oxide semiconductor (CMOS) devices manufactured by vertically stacking and interconnecting two or more integrated circuits to form a three-dimensional integrated circuit. Advantages of stacked semiconductor devices include reduced footprint and lower operating power than conventional two-dimensional integrated circuits. Additionally, the added dimensionality in the vertical dimension enables new opportunities in the design of CMOS devices.

Image sensors are one type of CMOS devices that have become ubiquitous and are now widely used in digital cameras, cellular phones, security cameras, as well as, medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is readout as analog image signals from the column bit lines and converted to digital values to produce digital images (i.e., image data) representative of the external scene.

As image sensors are integrated into a broader range of electronic devices it is desirable to enhance their functionality, performance metrics, and the like in as many ways as possible (e.g., resolution, power consumption, dynamic range, size, etc.) through both device architecture design as well as image acquisition processing.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale; emphasis instead being placed upon illustrating the principles being described.

DETAILED DESCRIPTION

Figure 1A:
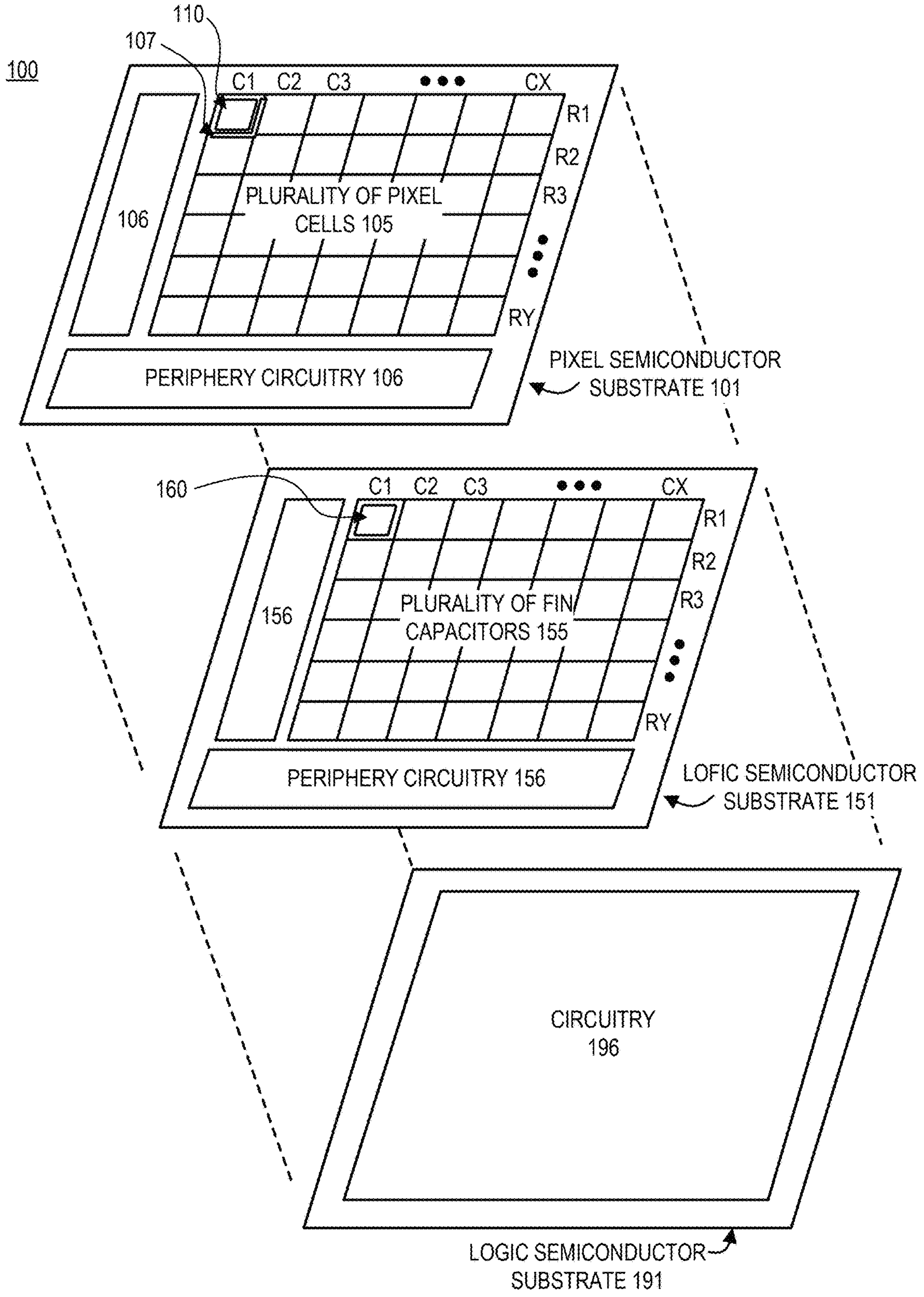
FIG. 1A illustrates an example of a stacked semiconductor device with fin capacitor, in accordance with embodiments of the disclosure.

Embodiments of an apparatus, system, and/or method related to a stacked semiconductor device with one or more fin capacitors are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

It will be understood that, although the terms first, second, third, etc., may be used herein to describe various elements, these elements should not be limited by these terms and should not be used to determine the process sequence or formation order of associated elements. Unless indicated otherwise, these terms are merely used to distinguish one element from another element. Thus, a first element discussed below could be termed a second element without departing from the teachings of the disclosed embodiments.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Embodiments described herein employ a stacked chip scheme (e.g., a stacked semiconductor device that utilizes multiple semiconductor substrates or wafers stacked vertically). Stacked chip schemes facilitate distribution of components of the stacked semiconductor device across multiple semiconductor substrates. In such a way, components may be offloaded to different substrates and occupancy area or fill factor of the stacked semiconductor device may be increased. In other words, lateral space on or in a given substrate may be more efficiently utilized. Additionally, the overall lateral space available within the stacked semiconductor device may be increased without increasing the physical footprint of the stacked semiconductor device. It is appreciated that semiconductor substrates included in the stacked semiconductor device may be fabricated using different technology nodes in a manner that power consumption of stacked semiconductor device can be lower or otherwise optimized. Image sensors in particular benefit from a stacked chip scheme as photodiode occupancy area on or in a pixel semiconductor substrate may be increased since components may be offloaded onto other semiconductor substrates (see, e.g., FIG. 1A) to free up space on the pixel semiconductor substrate to allow for increased pixel array size and sensitivity. The additional lateral area provided by the stacked chip scheme further facilitates design and performance improvements as will be seen in embodiments of the disclosure.

As will be discussed, embodiments of the disclosure related to a stacked semiconductor device including a plurality of fin capacitors (e.g., capacitors having one or more fin- or finger-like structures), which may be included in pixel cell circuitry when the stacked semiconductor device corresponds to an image sensor. In such an embodiment, the plurality of fin capacitors function as lateral overflow integration capacitors (LOFICs). It is appreciated that LOFICs may be included in pixel cell circuitry to increase full well capacity with improvement on image lag and thereby increase high dynamic range capabilities of the image sensor. LOFIC capacitance is positively correlated with full well capacity. Thus, as the capacitance of a LOFIC employed in pixel cell circuitry increases, the full well capacity also increases. For this reason, higher LOFIC capacitance is generally desired.

However, conventional LOFIC designs typically increase capacitance by utilizing a high-κ dielectric (e.g., insulating material with a dielectric constant greater than silicon dioxide such as hafnium-based dielectrics such as $HfO_2$, HfSiO, HfSiON, $Al_2O_3$, or the like) which results in increased image lag since, inter alia, the dipole at the interface between the high-κ dielectric and the metal electrode may trap stored charges and thereby increase the time necessary to discharge the conventional LOFIC. Another conventional LOFIC design is a traditional metal-oxide-semiconductor capacitor (MOSCAP) with increased lateral area, but such a design is not scalable as pixel size decreases (e.g., the lateral area of the MOSCAP needed for a target capacitor may be greater than a corresponding lateral area of a coupled photodiode).

The plurality of fin capacitors included in a stacked semiconductor device of embodiments disclosed herein address the limitations of conventional LOFIC designs and are capable of achieving high capacitance (e.g., a fin capacitor capable of having a capacitance from 80 fF to 150 fF when a lateral area of the fin capacitor is 4.4 $\mu m^2$ or less) without the use of a high-K dielectric (e.g., $SiO_2$ as the dielectric material disposed between first and second electrodes). The first and second electrodes are structured to respectively include a plurality of first fins nested with a plurality of second fins to increase the effective area of the fin capacitor without requiring an increased lateral area. Further, in some embodiments, the first electrode corresponds to a highly doped (e.g. dopant dosage of greater than $10^{14}$ ions/$cm^2$) semiconductor formed via epitaxy or implantation while the second electrode corresponds to polycrystalline silicon. It is appreciated that the configuration of the plurality of fin capacitors described in embodiments of the disclosure facilitates scaling with pixel cell size.

FIG. 1A illustrates an example of a stacked semiconductor device 100 with a plurality of fin capacitors 155, in accordance with embodiments of the disclosure. In the illustrated embodiment, the stacked semiconductor device 100 includes a pixel semiconductor substrate 101, a lateral overflow integration capacitor (LOFIC) semiconductor substrate 151, and a logic semiconductor substrate 191. Accordingly, the stacked semiconductor device 100 corresponds to an image sensor or imaging system. More specifically, the stacked semiconductor device 100 is a high-dynamic range image sensor that utilizes the plurality of fin capacitors 155 to facilitate increased full well capacity associated with each pixel cell and/or pixel cell circuitry with reduced image lag. The reduced image lag provided by the plurality of fin capacitors 155 may enable, for example, the stacked semiconductor device 100 to perform high dynamic range imaging with improved frame rates. It is appreciated that most embodiments of the disclosure discuss the plurality of fin capacitors 155 in the context of an image sensor. However, it is appreciated that in other embodiments, the configuration of individual fin capacitors included in the plurality of fin capacitors 155 may benefit other devices (e.g., memory devices, general purpose processes, or other integrated circuits).

Referring back to FIG. 1A, the LOFIC semiconductor substrate 151 may sometimes be referred to more generally as a semiconductor substrate or a first semiconductor substrate. The plurality of fin capacitors 155, include a fin capacitor 160 and optional periphery circuitry 156 disposed in or on the LOFIC semiconductor substrate 151. In one embodiment, optional periphery circuitry 156 may be integrated circuitry that includes one or more electronic components such as transistors or capacitors formed in or on the LOFIC semiconductor substrate 151. The pixel semiconductor substrate 101 may sometimes be referred to as a second semiconductor substrate. A plurality of pixel cells 105 and optionally periphery circuitry 106 are disposed in or on the pixel semiconductor substrate 101. The logic semiconductor substrate 191 is an optional substrate and may sometimes be referred to as a third semiconductor substrate. Circuitry 196 is disposed in or on the logic semiconductor substrate. It is appreciated that names of the pixel semiconductor substrate 101, the LOFIC semiconductor substrate 151, and the logic semiconductor substrate 191 may be indicative of the functionality of components included in or on said substrates. For example, the pixel semiconductor substrate includes light sensing elements (e.g., photodiodes such as pinned photodiodes included in the plurality of pixel cells 105) and associated pixel cell circuitry for readout of image charge, the LOFIC semiconductor substrate 151 includes a plurality of fin capacitors 155 to facilitate high dynamic range imaging with reduced image lag, and the logic semiconductor substrate 191 includes the circuitry 196 to facilitate operation of the stacked semiconductor device 100.

In the illustrated embodiment, the plurality of pixel cells 105 included in the pixel semiconductor substrate 101 are arranged in rows (e.g., R1, R2, R3, . . . RY) and columns (e.g., C1, C2, C3, . . . CX) to form a pixel cell array. Each pixel cell included in the plurality of pixel cells 105 may include any number of photodiodes (e.g., one, two, four, eight, or more photodiodes per pixel cell) sharing a common color filter type (e.g., red, green, blue, infrared, clear, transparent, cyan, magenta, yellow, black, or any other color filter to filter visible or non-visible light) to generate image charge in response to incident light. In most embodiments, the number of photodiodes per pixel cell included in the plurality of pixel cells 105 is uniform. In one embodiment, each pixel cell included in the plurality of pixel cells 105 includes exactly one photodiode. In other embodiments, each pixel cell included in the plurality of pixel cells 105 have a regular arrangement (e.g., a two-by-two arrangement of four photodiodes, a two-by-three arrangement of six photodiodes, a two-by-four arrangement of eight photodiodes, a four-by-four arrangement of sixteen photodiodes, or otherwise). In some embodiments, there is a one-to-one correspondence between photodiodes included in the plurality of pixel cells and fin capacitors included in the plurality of fin capacitors 155.

Figure 1B:
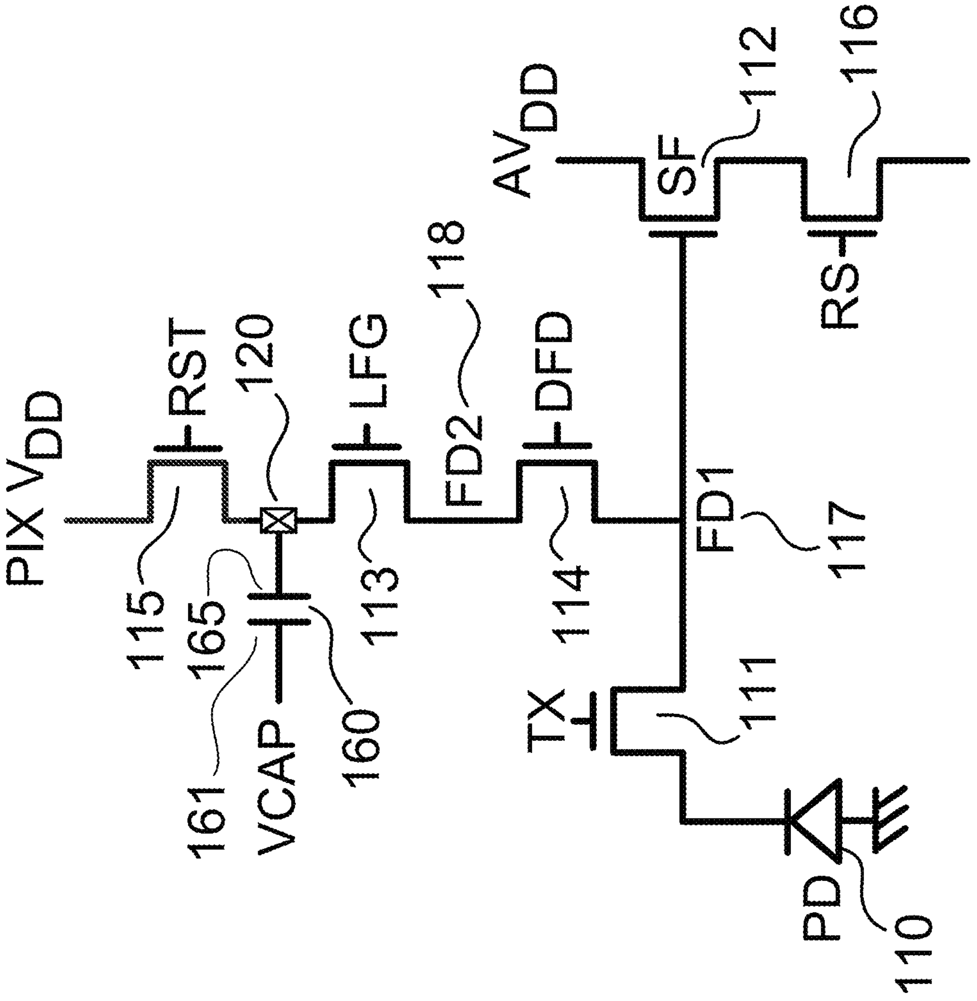
FIG. 1B illustrates an example schematic for readout of a pixel cell coupled to a fin capacitor of the stacked semiconductor device of FIG. 1A, in accordance with an embodiment of the disclosure.

The image charge generated by each pixel cell included in the plurality of pixel cells 105 may be readout or otherwise processed, at least in part, by respective pixel cell circuitry associated with a corresponding pixel cell included in the plurality of pixel cells 105 (see, e.g., FIG. 1B). The pixel cell circuitry (e.g., e.g., any one of or a combination of pixel transistors such as transfer transistors, reset transistors, source-follower transistors, row select transistors, switchable conversion gain transistors, and so on) may facilitate in transferring image charge overflow between the plurality of pixel cells 105 located in or on the pixel cell semiconductor substrate 101 and the plurality of fin capacitors 155 located in or on the LOFIC semiconductor substrate 151. In the illustrated embodiment, the pixel cell associated with the first row and first column of the pixel cell array formed by the plurality of pixel cells 105 includes a photodiode 110 and pixel cell circuitry 107, which are coupled to fin capacitor 160 included in the fin capacitor array formed by the plurality of fin capacitors 155. It is appreciated that each other instance of a pixel cell included in the plurality of pixel cells 105 may similarly include a corresponding instance of the photodiode 110 and the pixel cell circuitry 107 that is similarly coupled to a corresponding instance of the fin capacitor 160 included in the plurality of fin capacitors 155.

In the illustrated embodiment, the plurality of fin capacitors 155 are also arranged in rows (e.g., R1, R2, R3, . . . RY) and columns (e.g., C1, C2, C3, . . . CX) to form the fin capacitor array, which may have aligned elements with respect to the pixel cell array. Accordingly, in some embodiments an associated photodiode and pixel cell circuitry disposed in or on the pixel semiconductor substrate 101 are arranged to vertically overlap or otherwise be aligned with a coupled fin capacitor included in or on the LOFIC semiconductor substrate 151. More succinctly, the pixel semiconductor substrate 101 and the LOFIC semiconductor substrate 151 are vertically stacked such that each pixel cell included in plurality of pixel cells 105 overlaps with a corresponding fin capacitor included in the plurality of fin capacitors 155. In the illustrated embodiment, the photodiode 110 vertically overlaps the fin capacitor 160. In other words, there is at least a partial vertical overlap between the physical footprint of a given pixel cell included in the plurality of pixel cells 105 and a corresponding (i.e., coupled) fin capacitor included in the plurality of fin capacitors 155. For example, the photodiode 110 vertically overlaps with the fin capacitor 160. In the same or other embodiments, the pixel cell circuitry 107 vertically overlaps the fin capacitor 160. It is appreciated that the overlapping arrangement of associated photodiodes and pixel cell circuitry of a given pixel cell with a coupled fin capacitor reduces the distance between coupled components, simplifies manufacturing, and improves coupling.

In one embodiment, the periphery circuitry 106 included in or on the pixel semiconductor substrate 101 includes row-driver circuitry, timing generating circuitry, biasing circuitries, an array of capacitors, analog to digital circuitry, signal processing circuitry, combinations thereof and/or other circuitry to facilitate imaging an external scene with the plurality of pixel cells 105. In the same or another embodiment, the periphery circuitry 156 included in or on the LOFIC semiconductor substrate 151 includes one or more interconnect structures (see, e.g., FIG. 2A-2B) arranged laterally (e.g., to partially and/or completely surround the plurality of fin capacitors 155) and/or biasing circuitries. In the same or other embodiments, circuitry 196 included in or on the logic semiconductor substrate 191 includes application specific integrated circuitry (ASIC) for processing, inter alia, image signals readout by the pixel cell circuitry associated with the plurality of pixel cells 105. In the same or other embodiments, the circuitry 196 may include column readout circuitry, a central processing unit or image signal processor, memory elements, and/or interface or control circuits.

As illustrated in FIG. 1A, the pixel semiconductor substrate 101, the LOFIC semiconductor substrate 151, and/or the logic semiconductor substrate 191 include various analog and/or digital support circuitry for the stacked semiconductor device 100, respectively corresponding to the periphery circuitry 106, the periphery circuitry 156, and the circuitry 196. In some embodiments, support circuitry included in the periphery circuitry 106 and/or the periphery circuitry 156 may include, but is not limited to, row and column decoders and drivers, analog signal processing chains, digital imaging processing blocks, memory, timing and control circuits, input/output interfaces, a vertical scanner, sample and hold circuitry, amplifiers, analog-to-digital converter circuitry, and any other embodiments of logic and/or circuitry that is appropriate for the function of the stacked semiconductor device 100. In some embodiments, components that may be included in the periphery circuitry 106, periphery circuitry 156, or other components may additionally or alternatively be included in the logic semiconductor substrate 191 as part of the functionality of the circuitry 196 or otherwise.

In the illustrated embodiment of FIG. 1A, the stacked semiconductor device 100 is a stacked complementary metal-oxide semiconductor (CMOS) image sensor formed, at least in part, by the pixel semiconductor substrate 101, the LOFIC semiconductor substrate 151, and optionally the logic semiconductor substrate 191 that are stacked and coupled together (e.g., electrically and/or physically) in a stacked chip scheme achieved via a bonding scheme (e.g., oxide bonding, metal bonding, hybrid bonding), silicon connections (e.g., through silicon vias), other suitable circuit coupling technologies, or combinations thereof. Additionally, it is appreciated that the view presented in FIG. 1A may omit certain elements of the stacked semiconductor device 100 to avoid obscuring details of the disclosure. In other words, not all elements of the stacked semiconductor device 100 may be labeled, illustrated, or otherwise shown within FIG. 1A or other figures throughout the disclosure. It is further appreciated that in some embodiments, the stacked semiconductor device 100 may not necessarily include all elements shown. It is further appreciated that the term "semiconductor substrate" throughout the disclosure may correspond to a part of or an entirety of a semiconductor wafer (e.g., a silicon wafer). In some embodiments, the semiconductor substrate (e.g., the pixel semiconductor substrate 101, the LOFIC semiconductor substrate 151, and/or the logic semiconductor substrate 191) includes or is otherwise formed of silicon, a silicon germanium alloy, germanium, a silicon carbide alloy, an indium gallium arsenide alloy, any other alloys formed of III-V group compounds, combinations thereof, one or more epitaxial layers of the aforementioned materials, or a bulk substrate thereof. More specifically, the pixel semiconductor substrate 101, the LOFIC semiconductor substrate 151, and/or the logic semiconductor substrate 191 may correspond to any semiconductor material or combination of materials that may be doped or otherwise configured to facilitate the formation of an integrated circuit (e.g., forming individual circuitry components such as source/drain regions of transistors, memory elements, photodiodes, or the like). For example, the pixel semiconductor substrate 101 may correspond to one or more epitaxial layers (e.g., P or N doped silicon) formed on a carrier wafer. In such an embodiment, the photodiodes included in the plurality of pixel cells 105 may be formed in the one or more epitaxial layers corresponding to the pixel semiconductor substrate 101 while the carrier wafer may be removed or otherwise thinned during fabrication and may be subsequently stacked and interconnected with the LOFIC semiconductor substrate 151. In some embodiments, the pixel semiconductor substrate 101, the LOFIC semiconductor substrate 151, and/or the logic semiconductor substrate 191 may be formed of the same or different materials.

FIG. 1B illustrates an example schematic for readout of a pixel cell coupled to a fin capacitor 160 of the stacked semiconductor device 100 of FIG. 1A, in accordance with an embodiment of the disclosure. The example schematic is one possible implementation for the pixel cell circuitry 107 coupled to the fin capacitor 160 illustrated in FIG. 1A. It is appreciated that additional instances of the example schematic may be utilized for readout of other pixel cells included in the plurality pixel cells 105. As illustrated in FIG. 1B, the example schematic includes the photodiode 110, a transfer transistor 111, a source-follower transistor 112, a low conversion gain transistor 113, a dual floating diffusion transistor 114, a reset transistor 115, a row select transistor 116, a first floating diffusion FD1 117, and a second floating diffusion FD2 118.

The photodiode 110 is configured to photogenerate image charge in response to incident light. The first floating diffusion FD1 117 is coupled to receive the image charge from the photodiode 110 through the transfer transistor 111 (e.g., in response to a transfer control signal TX). The source-follower transistor 112 has a gate coupled to the first floating diffusion FD1 117 and the row select transistor 116 is coupled to the source-follower transistor 112 such that the row select transistor 116 is configured to output an image signal in response to a row select control signal RS and the amount of charge at the gate of the source follower transistor 112. The dual floating diffusion transistor 114 is coupled between the first floating diffusion FD1 117 and the second floating diffusion FD2 118. The second floating diffusion FD2 118 is coupled to receive excess image charge overflow from the photodiode 110 through the transfer transistor 111 and the dual floating diffusion transistor 114. The low conversion gain transistor 113 is coupled between the second floating diffusion FD2 118 and the reset transistor 115. The reset transistor 115 is coupled between a pixel voltage source $PIXV_{DD}$ and the low conversion gain transistor 113. The fin capacitor 160 is coupled between a voltage source VCAP (e.g., a bias voltage source) and the low conversion gain transistor 113. The low conversion gain transistor 113 is coupled between the first floating diffusion FD1 117 and the fin capacitor 160. The reset transistor 115, the dual floating diffusion transistor 114, and the low-conversion gain transistor 113 are respectively configured to be controlled in response to a reset control signal RST, a low conversion gain control signal LFG, and a dual floating diffusion control signal DFD.

As illustrated in FIG. 1B, the fin capacitor 160, which is a lateral overflow integration capacitor, is coupled between the voltage source VCAP and the low conversion gain transistor 113. More specifically, the fin capacitor 160 includes a first electrode (or capacitor bottom electrode) 161 included in the fin capacitor 160 coupled to the voltage source VCAP while a second electrode (capacitor top electrode) 165 included in the fin capacitor 160 is coupled to the low conversion gain transistor 113 and the reset transistor 115 via a bonding connection 120. The fin capacitor 160 is coupled to receive excess image charge overflow from the photodiode 110 through transfer transistor 111, the dual floating diffusion transistor 114, and low conversion gain transistor 113. It is appreciated that the fin capacitor 160 may be formed in or on a different substrate relative to other components included in the example schematic (e.g., the transfer transistor 111, the source-follower transistor 112, the low conversion gain transistor 113, the dual floating diffusion transistor 114, the reset transistor 115, the row select transistor 116, the voltage source VCAP, power supply $AV_{DD}$, and/or pixel voltage source (or power supply) PIX $V_{DD}$ may be included in the pixel cell circuitry 107 formed in or on the pixel semiconductor substrate 101 while the fin capacitor 160 included in the plurality of fin capacitors 155 may be formed in or on the LOFIC semiconductor substrate 151 as illustrated in FIG. 1A). Accordingly, as illustrated in FIG. 1B, there is a bonding connection 120 which couples one of the electrodes of the fin capacitor 160 between the reset transistor 115 and the low conversion gain transistor 113. In some embodiments, the fin capacitor 160 may have a capacitance higher than the first floating diffusion FD1 117 and the second floating diffusion FD2 118. In one embodiment, the capacitance or charge storing capacity of the first floating diffusion FD1 117 and the second floating diffusion FD2 118 are configured to be the same. In another embodiment, the capacitance of the first floating diffusion FD1 117 is configured to be less than the capacitance of the second floating diffusion 118. In some embodiments, the fin capacitor 160 may have a charge storage capacity greater than that of the photodiode 110.

In some embodiments, operation of a pixel cell included in the plurality of pixel cells 105 illustrated in the stacked semiconductor device 100 when pixel control circuitry includes the example schematic illustrated in FIG. 1B includes a pre-charge period, an integration period, a dual conversion gain (DCG) readout period, a LOFIC readout period, and a reset period. It is appreciated that control of the transfer transistor 111, the low conversion gain transistor 113, the dual floating diffusion transistor 114, the reset transistor 115, and the row select transistor 116 may be selectively controlled on or off with respective transfer control signal TX, low conversion gain control signal LFG, dual floating diffusion control signal DFD, reset control signal RST, and row select control signal RS. Accordingly, when a transistor is turned on or off there may be a corresponding signal or signal value applied to provide selective transistor control.

During the pre-charge period, the transfer transistor 111, the low conversion gain transistor 113, the dual floating diffusion transistor 114, and the reset transistor 115 are turned on, the row select transistor 116 is turned off, and the voltage source VCAP is configured to provide a high bias voltage (e.g., 2.8V) to the first electrode 161 while the pixel voltage source $PIXV_{DD}$ is configured to also provide a high bias voltage to the second electrode 165 to discharge or reset the fin capacitor 160, the photodiode 110, the first floating diffusion FD1 117, and the second floating diffusion FD2 118. During the integration period, which occurs after the pre-charge period, the photodiode 110 accumulates image charge in response to incident light when transfer transistor 111, the low conversion gain transistor 113, the dual floating diffusion transistor 114, the reset transistor 115, and the row select transistor 116 are turned off while the voltage source VCAP is configured to provide a low bias voltage (e.g., 1.4V) less than the high bias voltage (e.g., 2.8V). During the integration period, the gate voltages of transfer transistor 111, the low conversion gain transistor 113, and the dual floating diffusion transistor 114 may be properly configured such that excess photogenerated image charges may overflow form the photodiode 110 to the first floating diffusion 117, the second floating diffusion 118, and/or the fin capacitor 160.

During the DCG readout period, which occurs after the integration period, the transfer transistor 111, the low conversion gain transistor 113, and the reset transistor 115 are turned off, the row select transistor 116 is turned on, and the voltage source VCAP is configured to provide the high bias voltage. The DCG readout period includes two subperiods including a high conversion gain subperiod and a low conversion gain subperiod to respectively readout the photodiode 110 and output a high conversion gain signal and a low conversion gain signal. The high conversion gain signal is output during the high conversion gain subperiod of the DCG readout period when the dual floating diffusion transistor 114 is turned off while the low conversion gain signal is output during a low conversion gain subperiod of the DCG readout period when the dual floating diffusion transistor 114 is on. During the LOFIC readout period, which occurs after the DCG readout period, the transfer transistor 111, the low conversion gain transistor 113, the dual floating diffusion transistor 114, and the row select transistor 116 are turned on, the reset transistor 115 is turned off, and the voltage source VCAP is configured to provide the high bias voltage to output a LOFIC readout signal. During the reset period, the transfer transistor 111, the low conversion gain transistor 113, the dual floating diffusion transistor 114, and the reset transistor 115 are turned on, the row select transistor 116 is turned off, and the voltage source VCAP is configured to provide the high bias voltage to discharge or reset the fin capacitor 160, the photodiode 110, the first floating diffusion FD1 117, and the second floating diffusion FD2 118.

Figure 1C:
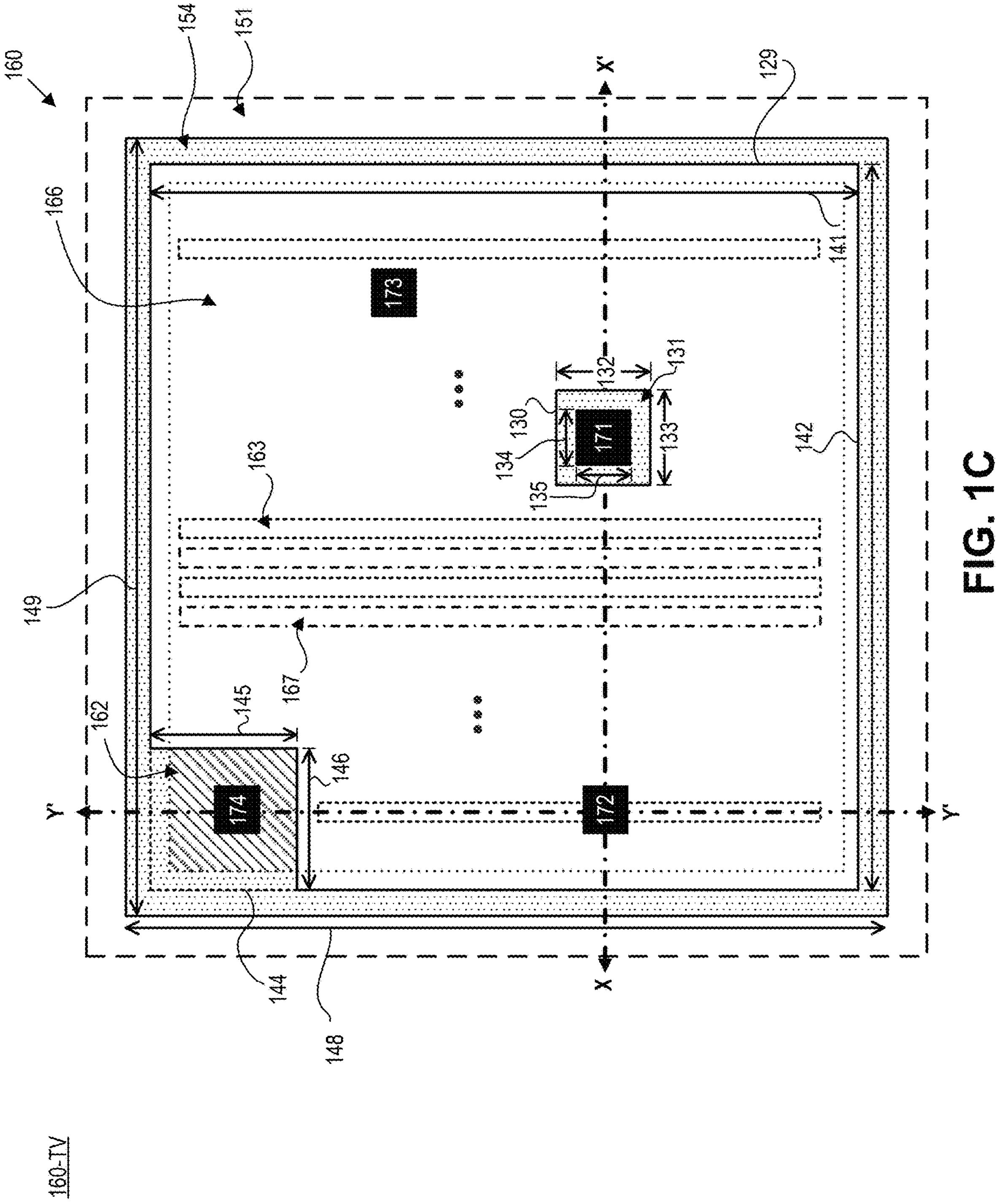
FIG. 1C illustrates a plan view of the fin capacitor included in the stacked semiconductor device of FIG. 1A, in accordance with an embodiment of the disclosure.
Figure 1D:
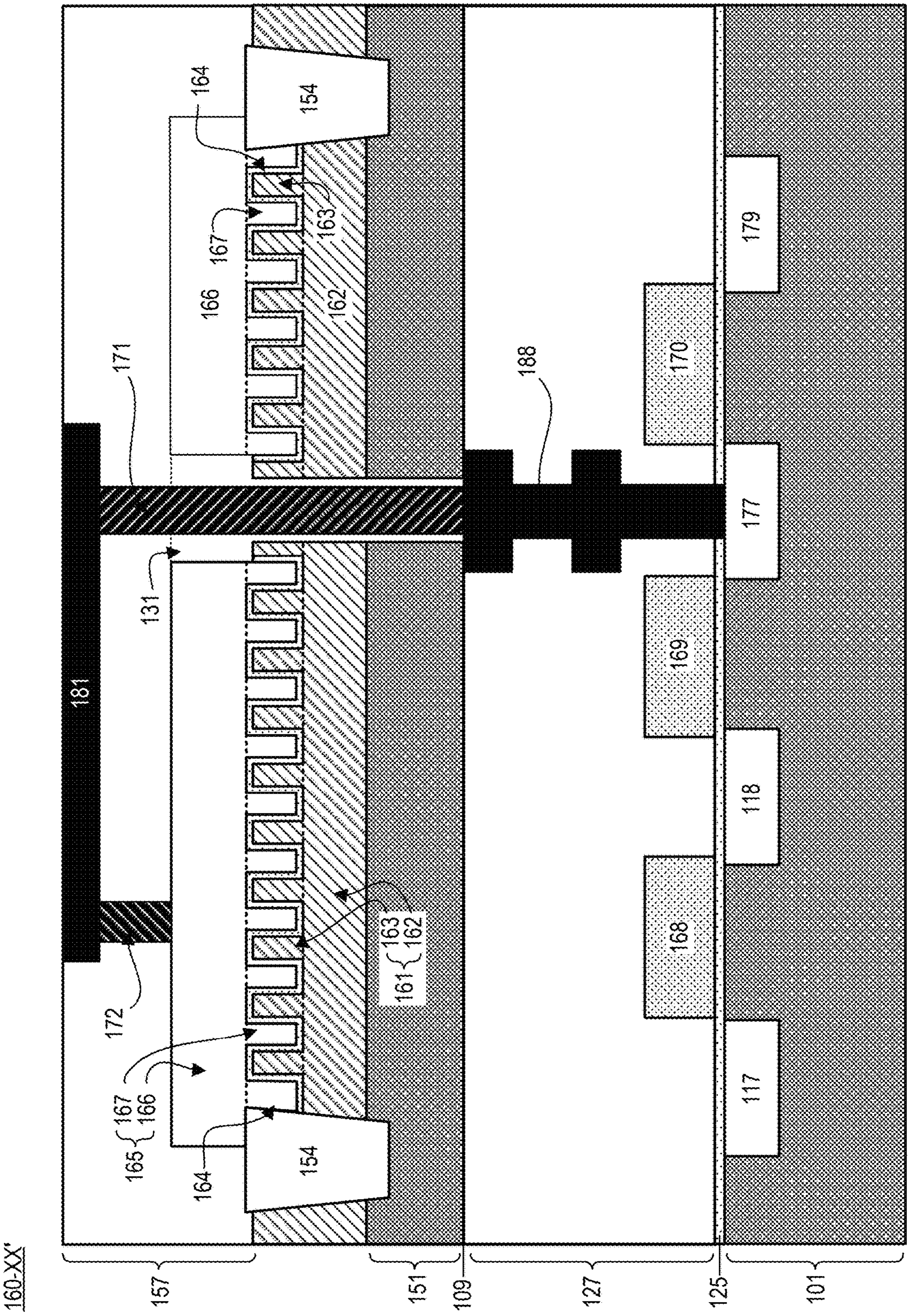
FIG. 1D illustrates a cross-sectional view along the line X-X' of the plan view of the fin capacitor illustrated in FIG. 1C, in accordance with an embodiment of the disclosure.
Figure 1E:
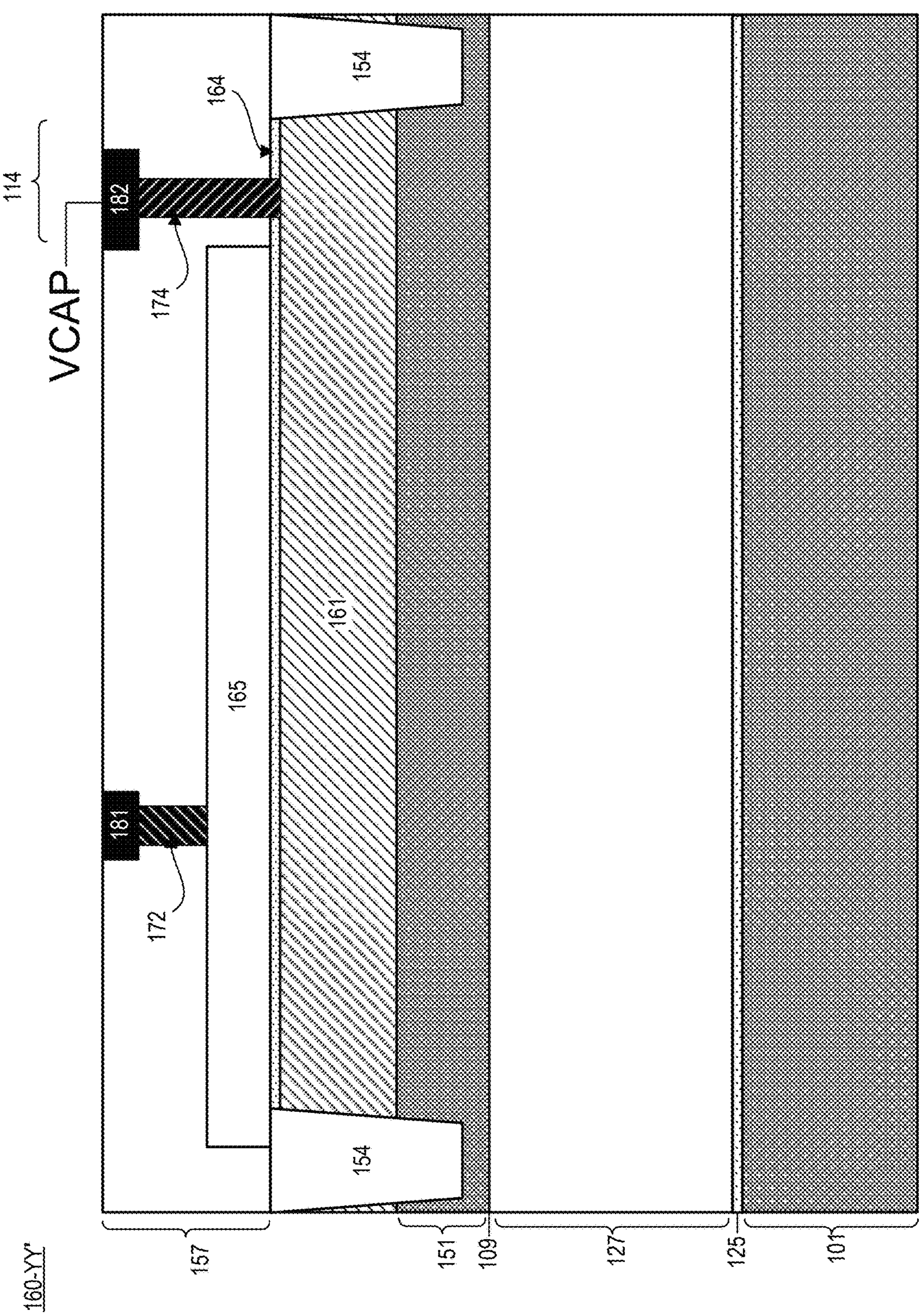
FIG. 1E illustrates a cross-sectional view along the line Y-Y' of the plan view of the fin capacitor illustrated in FIG. 1C, in accordance with an embodiment of the disclosure.

FIG. 1C-1E illustrate a plan view 160-TV, a cross-sectional view 160-XX', and a cross-sectional view 160-YY' of the fin capacitor 160 included in the stacked semiconductor device 100 illustrated in FIG. 1A-1B. It is appreciated that the fin capacitor 160 (e.g., the first fin capacitor) is one of many fin capacitors included in the plurality of fin capacitors 155 illustrated in FIG. 1A. In some embodiments, each other fin capacitor included in the plurality of fin capacitors 155 may correspond to additional instances of the fin capacitor 160 and thus may be similarly described or illustrated in accordance with embodiments of the disclosure. The views illustrated by FIG. 1C-1E of the stacked semiconductor device 100 include the pixel semiconductor substrate 101, a bonding interface 109, the first floating diffusion 117, the second floating diffusion 118, a gate dielectric 125, a dielectric layer 127, an outer boundary 129 of the first fin capacitor 160, an inner boundary 130 of the first fin capacitor 160, an isolation structure 131, a recess 144, the LOFIC semiconductor substrate 151, an isolation structure 154, a dielectric layer 157, the first electrode 161 including a first planar portion 162 and a plurality of first fins 163, an insulating material 164, the second electrode 165 including a second planar portion 166 and a plurality of second fins 167, a gate electrode 168, a gate electrode 169, a gate electrode 170, a deep contact via 171, a shallow contact via 172, a shallow contact via 173, a contact via 174, a source/drain region 177, a source/drain region 179, a metal wire 181, a metal wire 182, and an interconnect structure 188.

FIG. 1C illustrates a plan view 160-TV of the fin capacitor 160 included in the stacked semiconductor device 100 of FIG. 1A, in accordance with an embodiment of the disclosure. As illustrated, the fin capacitor 160 includes the first electrode 161, which may comprise or consist of the first planar portion 162 and the plurality of first fins 163, and the second electrode 165, which may comprise or consist of the second planar portion 166 and the plurality of second fins 167. In some embodiments, the plurality of first fins 163 extend directly from the first planar portion 162 and the plurality of second fins 167 extend directly from the second planar portion 166. In other words, the plurality of first fins 163 directly contacts the first planar portion 162 and the plurality of second fins 167 directly contacts the second planar portion 166. In some embodiments, the first electrode 161 has a substantially uniform composition throughout (e.g., the first planar portion 162 and the plurality of first fins 163 have a same composition) and/or the second electrode 165 has a substantially uniform composition throughout (e.g., the second planar portion 166 and the plurality of second fins 167 have a same composition). It is appreciated that the term "substantially" means the composition does not deviate beyond the limitations of the manufacturing constraints utilized to form the fin capacitor 160. In some embodiments, the first planar portion 162 and the plurality of first fins 163 are a monolithic structure to form the first electrode 161 and/or the second planar portion 166 and the plurality of second fins 167 are a monolithic structure to form the first electrode 161. In one embodiment, the first electrode 161 includes or otherwise corresponds to a doped semiconductor material having a first conductivity type different than a second conductivity type of the LOFIC semiconductor substrate 151. In one embodiment, the first electrode 161 is an N-type majority charge carrier while the LOFIC semiconductor substrate 151 is a P-type majority charge carrier. In one embodiment, the first electrode 161 is highly doped (e.g., a dopant dosage greater than $10^{14}$ ions/$cm^2$) formed via implantation (e.g., of dopants into the LOFIC semiconductor substrate 151 to form a highly doped region in the LOFIC semiconductor substrate 151) or epitaxial growth (e.g., on or in the LOFIC semiconductor substrate 151). In some embodiments, the second electrode 163 is formed of a conductive material such as polysilicon material or metal material.

In the illustrated embodiment, the fin capacitor 160 is laterally surrounded by isolation structure 154 (e.g., a trench isolation structure such as a shallow trench isolation structure and/or a deep trench isolation structure that includes an insulating material such as silicon dioxide) to physically separate and electrically isolate, the fin capacitor 160 from adjacent fin capacitors included in the plurality of fin capacitors 155 on the LOFIC semiconductor substrate 151. In some embodiments, the isolation structure 154 is a patterned structure that extends laterally entirely around at least one of the first electrode 161 (e.g., the first planar portion 162 and/or the plurality of first fins 163) or the second electrode 165 (e.g., the second planar portion 166 and/or the plurality of second fins 167). The first electrode 161 and the second electrode 165 are vertically stacked and arranged such that the plurality of first fins 163 and the plurality of second fins 167 are nested between one another (see, e.g., FIG. 1D). In some embodiments, the second planar portion 166 may be extended laterally and land on the isolation structure 154.

In one embodiment, a second lateral area of the second planar portion 166 of the second electrode 165 is greater than a first lateral area of the first planar portion 162 of the first electrode 161 as shown by the lateral dimensions 141, 142, 145, and 146 of the second planar portion 166 being larger than the lateral dimensions of the first planar portion 162. In the same or other embodiments, the second electrode 165 (e.g., the second planar portion 166) is notched to form the recess 144 such that the second planar portion 166 does not completely cover the first planar portion 162 to facilitate access (e.g., for a contact pad, via such as the contact via 174, and/or associated contact pad or metal wire) to the underlying first electrode 161, or more specifically, the first planar portion 162. In the illustrated embodiment, the recess 144 occurs at a corner of the second planar portion 166 (e.g., the second planar portion 166 has a notched corner). However, it is appreciated that the recess 144 of the second planar portion 166 may be formed at non-corner locations (e.g., middle edge of the planar portion) or at non-edge positions (e.g., the second planar portion 166 may have an opening to allow for access to the underlying first electrode 161). In other words, the second planar portion 166 is notched or otherwise shaped to form one or more recesses, indentations, or openings to enable contact with the underlying second planar portion 162 of the second electrode 165. Facilitated by the recess 144, the contact via 174 may couple a source (e.g., the voltage source VCAP illustrated in FIG. 1B) to the first electrode 161 of the fin capacitor 160. In some embodiments, the contact via 174 is disposed proximate to recess 144 of the second electrode 165 (e.g., the contact via 174 is positioned within the recess 144 to be at least partially surrounded by the second planar portion 166 of the second electrode 165.

The illustrated embodiment further includes one or more shallow contact vias 172 and 173 and the deep contact via 171 to facilitate an electrical connection between the second electrode 165, or more specifically the second planar portion 166, and circuitry disposed in or on the pixel semiconductor substrate 101 (e.g., via bonding connection 120 illustrated in FIG. 1B). The shallow contact vias 172 and 173 are coupled to the second planar portion 166 of the second electrode 165 and the deep contact via 171 (e.g., via metal wire 181 as illustrated in FIG. 1D). The deep contact via 171 extends through the inner boundary 130 of the fin capacitor 160 such that the deep contact via 171 is laterally surrounded by the first electrode 161 and the second electrode 165. In one embodiment, the deep contact via 171 is electrically isolated from the first electrode 161 and the substrate material of the LOFIC semiconductor substrate 151 by, for example, an insulation layer. In the illustrated embodiment, the shallow contact via 172 is coupled to the second electrode 165 and the deep contact via 171. Further, the deep contact via 171, the shallow contact via 172, and the contact via 174 may be arranged such that a first line coincident with the deep contact via 171 and the shallow contact via 172 (e.g., line X-X') is perpendicular to a second line coincident with the shallow contact via 172 and the contact via 174 (e.g., line Y-Y').

In the illustrated embodiment, the plurality of first fins 163 and the plurality of second fins 167 run in a direction parallel to the second line (e.g., line Y-Y'). However, in other embodiments, the directionality of the plurality of first fins 163 and the plurality of second fins 167 may be perpendicular to the second line and parallel to the first line (e.g., line X-X'). However, it is appreciated that in most embodiments, the plurality of first fins 163 and the plurality of second fins 167 extend parallel to one another to allow for the plurality of first fins 163 to be nested with the plurality of second fins 167. Accordingly, when viewed from a plan view (e.g., as shown in FIG. 1C), the plurality of first fins 163 and the plurality of second fins 167 alternate. The plurality of first fins 163 and the plurality of second fins 167 may extend "end-to-end" with respect to a lateral dimension of the second planar portion 166. For example, in one embodiment, the plurality of first fins 163 and the plurality of second fins 167 may extend a length corresponding to the lateral dimension 141 (e.g., a width or length) of the second planar portion 166. In one embodiment, the plurality of first fins 163 and the plurality of second fins 167 have a same length (e.g., along a direction parallel to the line Y-Y'), a same width (e.g., along a direction parallel to the line X-X'), and/or a same height (e.g., into or out of the page for the view illustrated in FIG. 1C). In another embodiment, the plurality of first fins 163 and the plurality of second fins 167 have different lengths, widths, and/or heights.

It is appreciated that the effective area used to determine a capacitance of the fin capacitor 160 corresponds to where the first electrode 161 overlaps with the second electrode 165. As illustrated, a lateral area of the fin capacitor 160 is defined (e.g., based on the configuration of the first electrode 161 and the second electrode 165) by the outer boundary 129 and the inner boundary 130. Since the second planar portion 166 has the second lateral area greater than the first lateral area of the first planar portion 162, the outer boundary 129 of the fin capacitor 160 is defined by the lateral area of the second planar portion 166. The inner boundary 130 is similarly defined by the second planar portion 166 as the first planar portion 162 extends closer to the deep contact via 171 compared to the second planar portion 166 (see, e.g., FIG. 1D). Accordingly, based on the lateral dimensions 132, 133, 141, 142, 145, and 146, the pitch of the plurality of first fins 163 and/or the plurality of second fins 167, the height or depthwise thickness of the plurality of first fins 163 and/or the plurality of second fins 167, and the thickness of the insulating material disposed between the first electrode 161 and the second electrode 165, an effective capacitance of the fin capacitor 160 may be determined. In other words, the plurality of first fins 163 and the plurality of second fins 167 provide extra effective area for the fin capacitor 160. For example, a lateral area of the fin capacitor 160 based on the lateral dimensions 141, 142, 145, and 146 may correspond to approximately 2.2 $\mu m^2$, but the effective capacitor area based on the, the lateral area of the second planar portion 166 plurality of first fins 163 and the plurality of second fins 167 may be approximately 10.7 $\mu m^2$. In other words, the plurality of first fins 163 and the plurality of second fins 167 may provide up to a fivefold increase in effective capacitor area relative to the physical footprint (e.g., lateral area) of the fin capacitor 160. It is appreciated that in order to achieve the increased effective capacitor area, the plurality of first fins 163 and the plurality of second fins 167 may collectively form from 20 fins to 100 fins. It is appreciated that the number of fins may be limited based on the target physical footprint of the fin capacitor 160 and the critical dimension of the manufacturing process (e.g., fin width or fin pitch may be limited based on manufacturing constraints). In one embodiment, the plurality of first fins 163 and the plurality of seconds fins 167 are configured such that the fin capacitor has a capacitance from 80 fF to 150 fF when a lateral area of the fin capacitor is 4.4 $\mu m^2$ or less.

FIG. 1D illustrates a cross-sectional view 160-XX' along the line X-X' of the plan view of the fin capacitor 160 illustrated in FIG. 1C, in accordance with an embodiment of the disclosure. As illustrated, the plurality of first fins 163, which extends from the first planar portion 162, is nested with the plurality of second fins 167, which extends from the second planar portion 166, such that the plurality of first fins 163 and the plurality of second fins 167 are both disposed between the first planar portion 162 and the second planar portion 166. It is appreciated that by being nested, a given fin included in the plurality of first fins 163 is disposed between two adjacent fins of the plurality of second fins 167. Similarly, a given fin included in the plurality of second fins 167 is disposed between two adjacent fins included in the plurality of first fins 163. As illustrated, the first electrode 161 is separated from the second electrode 165 by the insulating material 164 (e.g., silicon dioxide and/or silicon oxynitride) such that the first electrode 161, the second electrode 165, and the insulating material 164 collectively form the fin capacitor 160. In some embodiments, a separation distance along a depthwise direction between the first planar portion 162 and the second planar portion 166 corresponds to a depth the plurality of first fins 163 and/or the plurality of second fins 167 extend plus twice a thickness of the insulating material 164. It is appreciated that in some embodiments, proximal ends of the plurality of first fins 163 are disposed between distal ends of the plurality of first fins 163 and the first planar portion 162. In some embodiments, the second planar portion 166 extends over the isolation structure 154 such that the isolation structure 154 is disposed, at least in part, between the second planar portion 166 and the semiconductor substrate 161.

As previously discussed, the first electrode 161 is disposed between the LOFIC semiconductor substrate 151 and the second electrode 165. In some embodiments, the first electrode 161 corresponds to an epitaxial layer grown on the LOFIC semiconductor substrate 151. In another embodiment, the first electrode 161 corresponds to a region of the LOFIC semiconductor substrate 151 doped (e.g., via implantation) of an opposite conductivity type of the LOFIC semiconductor substrate 151. In one embodiment, the LOFIC semiconductor substrate is a P-type semiconductor material while the first electrode 161 is a highly doped N-type semiconductor material. In the illustrated embodiment, the first electrode 161 is laterally surrounded by the isolation structure 154. More specifically, the isolation structure 154 extends a depth to entirely through the epitaxial layer and into a LOFIC semiconductor substrate 151 to isolate the illustrated fin capacitor (e.g., the fin capacitor 160) from adjacent fin capacitors included in the plurality of fin capacitors 155. The second electrode 165 of the fin capacitor 160 is disposed within the dielectric layer 157 (e.g., an intermetal dielectric and/or one or more interlayer dielectrics). It is appreciated that in some embodiments, the isolation structure 154 is a shallow trench isolation structure that extends into the LOFIC semiconductor substrate 151 a depth such that a thickness of the isolation structure 154 is greater than a thickness of the first electrode 161 and/or a thickness of the epitaxial layer the first electrode 161 is formed therefrom.

In the illustrated embodiment, the second electrode 165 is coupled to circuitry (e.g., the source/drain region 177 of a low conversion gain transistor) with at least one of the shallow contact via 172, the metal wire 181, the deep contact via 171, and the interconnect structure 188. The circuitry is disposed in or on a substrate (e.g., the pixel semiconductor substrate 101) different from the substrate the fin capacitor 160 is disposed in or on (e.g., the LOFIC semiconductor substrate 151). The shallow contact via 172 extends through the dielectric layer 157 and is coupled between the metal wire 181 and the second electrode 165. The metal wire 181 is coupled between the deep contact via 171 to the shallow contact via 172. The deep contact via 171 extends through the inner boundary 130 (e.g., as illustrated in FIG. 1C) of the fin capacitor 160 such that the deep contact via 171 is laterally surrounded by the first electrode 161 and the second electrode 165. More specifically, the deep contact via 171 extends from the dielectric layer 157 to the bonding interface 109 (e.g., where the LOFIC semiconductor substrate 151 is coupled to the dielectric layer 157 associated with the pixel semiconductor substrate 101). The deep contact via 171 extends entirely through the LOFIC semiconductor substrate 151 and electrically isolated from the LOFIC semiconductor substrate 151. In some embodiments, the deep contact via 171 extends a vertical depth greater than a combined thickness of the first electrode 161, the second electrode 165, and the LOFIC semiconductor substrate 151. It is appreciated that the deep contact via 171 is isolated from inner sidewalls (e.g., defined or otherwise formed by the inner boundary 130 of the fin capacitor illustrated in FIG. 1C) of the first electrode 161, the second electrode 165, and the LOFIC semiconductor substrate 151 with the isolation structure 131 (e.g., an insulating material such as silicon dioxide deposited to conformally coat the inner sidewalls of the first electrode 161, the second electrode 165, and the LOFIC semiconductor substrate 151 with the isolation structure 131). In some embodiments, a lateral separation distance between the inner sidewalls of the second electrode 165 and the deep contact via 171 is greater than corresponding lateral separation distances between the first electrode 161 or the LOFIC semiconductor substrate 151 and the deep contact via 171. In other words, in some embodiments, the deep contact via 171 is disposed laterally closer to the LOFIC semiconductor substrate 151 and the first electrode 161 compared to the second electrode 165.

As illustrated, the deep contact via 171 extends to the bonding interface 109 to contact the interconnect structure 188 (e.g., one or more metal wires and/or vias disposed within the dielectric layer 127). In some embodiments, the fin capacitor 160 (e.g., a combination including at least the first electrode 161 the insulating material 164, and the second electrode 165) disposed in or on the LOFIC semiconductor substrate 151 is directly coupled to source/drain electrode (e.g., source/drain region 177) of a transistor, disposed in or on the pixel semiconductor substrate 101 (e.g., low conversion gain transistor 113 or dual floating diffusion transistor 114 illustrated in FIG. 1B), that has a source/drain region corresponding to or selectively coupled to a floating diffusion (e.g., FD2 118 or FD1 117). It is appreciated that a "direct" coupling between the fin capacitor 160, or more specifically the first electrode 161 or second electrode 165) means that one or more metal wires or vias (e.g., deep contact via 171, shallow contact via 172, interconnect structure 181, or combinations thereof) may facilitate an electrical connection between the fin capacitor 160 and the source/drain of the transistor without any components of other transistors disposed therebetween.

The interconnect structure 188 is subsequently coupled between the deep contact via 171 and the circuitry included in or on the pixel semiconductor substrate 101. The circuitry may correspond to pixel cell circuitry (e.g., the pixel cell circuitry 107 illustrated in FIG. 1A-1B) for operating a corresponding vertically aligned or overlapping capacitor (e.g., the fin capacitor 160) included in the plurality of fin capacitors 155. The interconnect structure 188 is disposed within the dielectric layer 127 and further extends through the gate dielectric 125 to contact the source/drain region 177 included in the circuitry of the pixel semiconductor substrate 101. The dielectric layer 127 is similar in many respects to the dielectric layer 157 and may correspond to an intermetal dielectric and/or one or more interlayer dielectrics that include an insulating material (e.g., silicon dioxide). The gate dielectric 125 (e.g., silicon dioxide) in combination with the gate electrodes 168, 169, and 170 (e.g., metal such as gold, silver, aluminum, copper, polycrystalline silicon (i.e., polysilicon), a silicide material, composite metals, or other materials known in the art), the first floating diffusion 117, the second floating diffusion 118, and the source/drain regions 177, and 179 (e.g., regions of the pixel semiconductor substrate 101 doped to have a conductivity type opposite of the pixel semiconductor substrate 101) are included in the pixel cell circuitry for photodiode readout.

FIG. 1E illustrates a cross-sectional view 160-YY'along the line Y-Y' of the plan view of the fin capacitor 160 illustrated in FIG. 1C, in accordance with an embodiment of the disclosure. As illustrated, the first electrode 161 is separated from the second electrode 165 by the insulating material 164. The shallow contact via 172 is coupled between the second electrode 165 and the metal wire 181. The contact via 174 extends through the insulating material 164 and is coupled between the first electrode 161 and the metal wire 182. In the illustrated embodiment. The metal contact via 174 is further coupled to the voltage source (e.g., voltage source supplying the VCAP illustrated in FIG. 1B) via the metal wire 182. Accordingly, the contact via 174 is configured to couple the voltage source to the first electrode 161 of the fin capacitor 160. In the illustrated view of cross-sectional view 160-YY', the first electrode 161 extends laterally beyond the second electrode 165 such that there is the recess 144 to facilitate access to the first electrode 161 (e.g., the first electrode 161 is not entirely covered by the second electrode 165). Consequently, the contact via 174 is disposed proximate to the recess 144 of the second electrode 165.

Figure 2A:
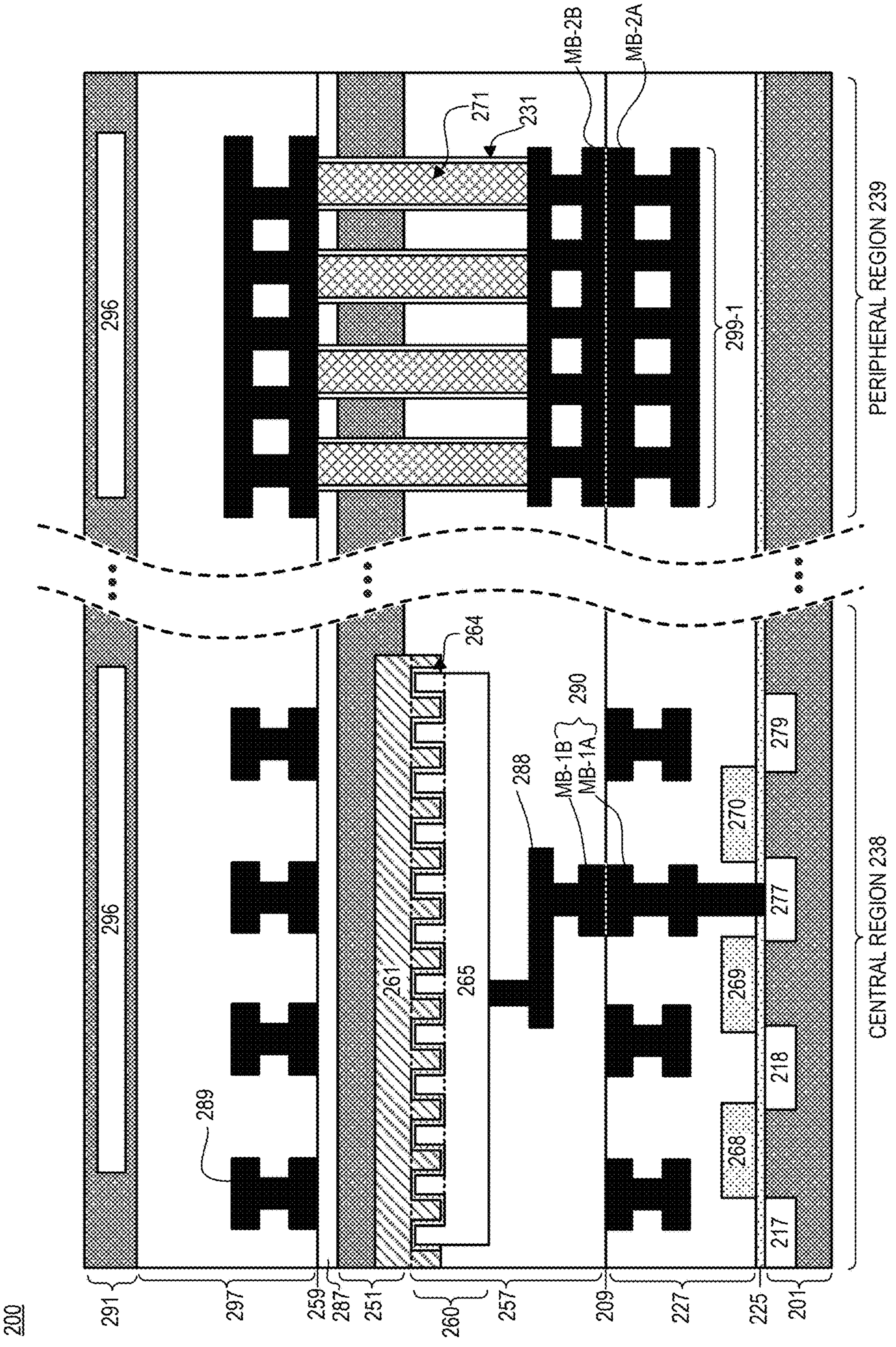
FIG. 2A illustrates a cross-sectional view of a stacked semiconductor device with fin capacitor, in accordance with embodiments of the disclosure.
Figure 2B:
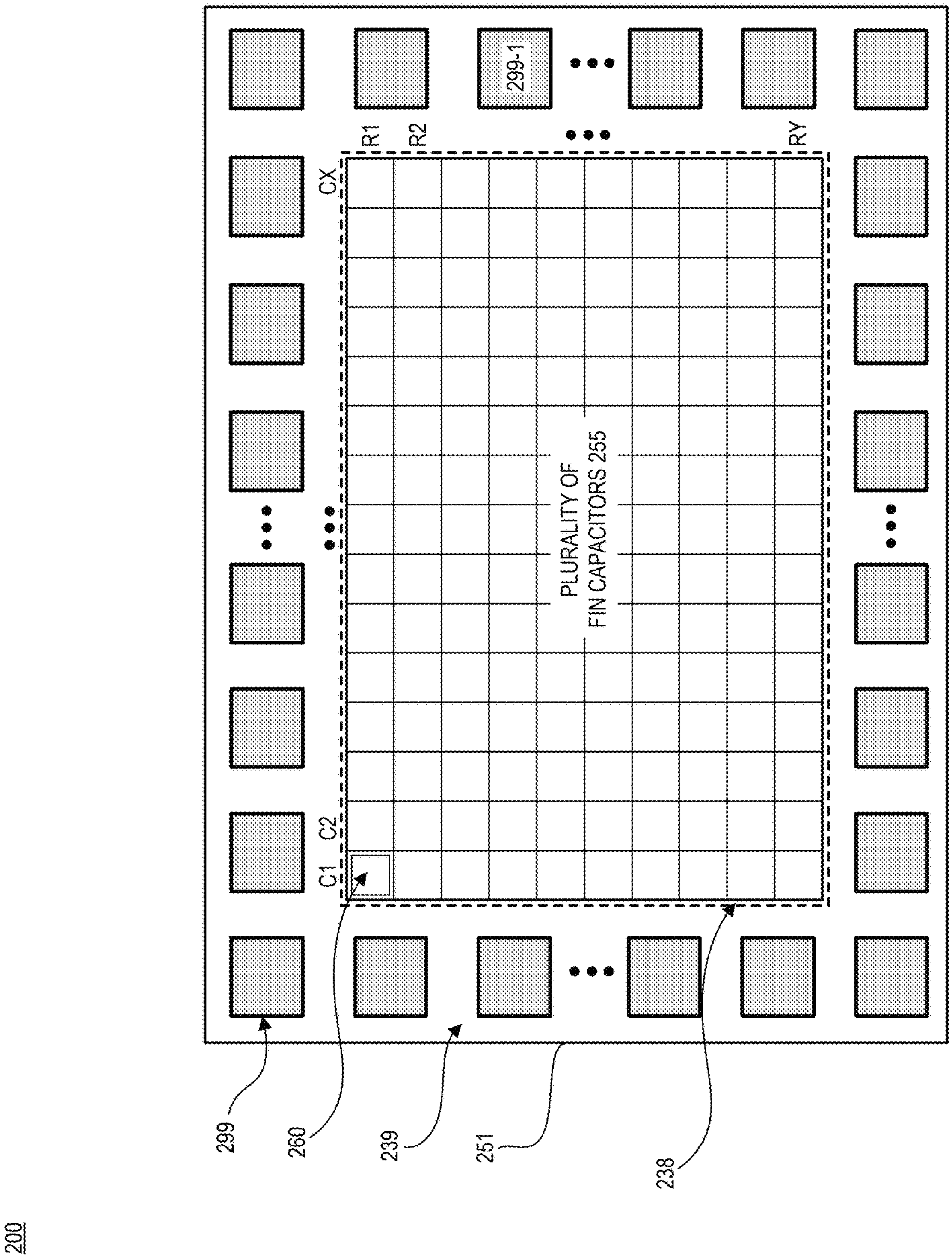
FIG. 2B illustrates a plan view of the stacked semiconductor device including a plurality of fin capacitors laterally surrounded by a plurality of deep contact structures, in accordance with an embodiment of the disclosure.

FIGS. 2A and 2B respectively illustrate cross-sectional and plan views of a stacked semiconductor device 200, which may be similar in many regards to the stacked semiconductor device 100 illustrated in FIG. 1A-1B. Accordingly, the stacked semiconductor device 200 includes many like-labeled features that may have corresponding elements included in the stacked semiconductor device 100. For example, the stacked semiconductor device 200 includes a pixel semiconductor substrate 201, a LOFIC semiconductor substrate 251, and a logic semiconductor substrate 291 which respectively correspond to the pixel semiconductor substrate 101, the LOFIC semiconductor substrate 151, and the logic semiconductor substrate 191 of the stacked semiconductor device 100. The stacked semiconductor device 200 similarly includes a plurality of fin capacitors 255 which respectively corresponds to the plurality of fin capacitors 155. The plurality of fin capacitors 255 includes a fin capacitor 260 having a first electrode 261 and a second electrode 265 which respectively correspond to the fin capacitor 160 including the first electrode 161 and the second electrode 165 of the stacked semiconductor device 100. The stacked semiconductor device 200 further includes gate electrodes 268, 269, and 270, first floating diffusion 217, second floating diffusion 218, source/drain region 277, and source/drain region 279 which respectively correspond to the gate electrodes 168, 169, 170, the first floating diffusion 217, the second floating diffusion 218, the source/drain region 177, and the source/drain region 179 of the stacked semiconductor device 100. The stacked semiconductor device 200 further includes gate dielectric 225, dielectric layer 227, dielectric layer 257, and insulating material 264 which respectively correspond to the gate dielectric 125, the dielectric layer 127, the dielectric layer 157, and the insulating material 164 of the stacked semiconductor device 100. It is appreciated that the embodiment illustrated in FIG. 2A-2B does not necessarily show all overlapping features with the embodiment illustrated in FIG. 1A-1E. However, it is appreciated that the stacked semiconductor device 200 and the stacked semiconductor device 100 may include the same or similar features and thus features of the stacked semiconductor device 200 may similarly be included in the stacked semiconductor device 100 and/or features of the stacked semiconductor device 100 may similarly be included in the stacked semiconductor device 200 in accordance with embodiments of the disclosure.

FIG. 2A illustrates a cross-sectional view of the stacked semiconductor device 200 with a fin capacitor 260, in accordance with embodiments of the disclosure. One difference between the stacked semiconductor device 200 and the stacked semiconductor device 100 is that the LOFIC semiconductor substrate 251 and the pixel semiconductor substrate 201 are configured to have front sides facing one another while in the stacked semiconductor device 100 (e.g., face to face configuration), the backside of the LOFIC semiconductor substrate 151 faces the front side of the pixel semiconductor substrate 101. The configuration of the stacked semiconductor device 200 results in the second electrode 265 being disposed between the pixel semiconductor substrate 201 and the first electrode 261, which is different than the configuration of the stacked semiconductor device 100 where the first electrode 161 is disposed between the pixel semiconductor substrate 101 and the second electrode 165 (see, e.g., FIG. 1D). In the embodiment illustrated in FIG. 2A, the fin capacitor 260 is coupled to a corresponding circuitry disposed in or on the pixel semiconductor substrate 201 (e.g., transistors formed from the first floating diffusion 217, the second floating diffusion 218, the source/drain region 277, the source/drain region 279, the gate dielectric 225, and the gate electrodes 268, 269, and 270). In some embodiments, the circuitry as associated with the pixel semiconductor substrate 201 corresponds to pixel cell circuitry (e.g., corresponding to the pixel cell circuitry 107 illustrated in FIG. 1A). Referring back to FIG. 2A, the second electrode 265 is coupled to the corresponding circuitry with a hybrid bond connection at the bonding interface 209 (e.g., provided by the multilayer interconnect structure 288 which extends through the gate dielectric 225 to contact the source/drain region 277 such as a drain of low conversion gain transistor 113 and a source of the reset transistor 115 of FIG. 1B) disposed between the LOFIC semiconductor substrate 251 and the pixel semiconductor substrate 201. In such an embodiment, the multilayer interconnect structure 288 extends through the dielectric layer 257 associated with the LOFIC semiconductor substrate 251 and the dielectric layer 227 associated with the pixel semiconductor substrate 201.

The stacked semiconductor device 200 further includes the logic semiconductor substrate 291. In some embodiments, the logic semiconductor substrate 291 includes logic circuitry 296 (e.g., corresponding to the circuitry 196 illustrated in FIG. 1A). The LOFIC semiconductor substrate 251 is disposed between the pixel semiconductor substrate 201 and the logic semiconductor substrate 291. In the illustrated embodiment, the fin capacitor 260, as well as any other fin capacitor included in a plurality of fin capacitors (e.g., the plurality of fin capacitors 155 illustrated in FIG. 1A), is disposed within a central region 238 that is laterally surrounded by a peripheral region 239. In some embodiments, peripheral region 239 may refer to regions outside of the central region 238. The peripheral region 239 includes a plurality of deep contact structures 299 (e.g., deep contact structure 299-1) which laterally surround the central region 238, or more specifically the plurality of fin capacitors 255 (see, e.g., FIG. 2B). The deep contact structure 299-1 may be representative of every other deep contact structure included in the plurality of deep contact structures 299. In one embodiment, the deep contact structure 299-1 includes a plurality of deep contact vias 271 extending entirely through the LOFIC semiconductor substrate 251 to couple the logic circuitry 296 of the LOFIC semiconductor substrate 291 to the pixel cell circuitry included in the pixel semiconductor substrate 201. In other words, the plurality of deep contact structures 299 is coupled to the logic circuitry 296 to receive the image signals output by the pixel cell circuitry. In some embodiments, each of plurality of deep contact vias 271 is electrically isolated from the LOFIC semiconductor substrate 251. In the same or another embodiment, each of plurality of deep contact vias 271 may extend vertically between a corresponding segment of the multi-layer interconnect structure 289 and a corresponding segment of the multilayer interconnect structure 288 within the peripheral region 239.

In some embodiments, the first electrode 261 is coupled to the deep contact structure 299-1. In one embodiment, multi-layer interconnect structure 289 includes metal wires and vias coupled between the first electrode 261 and the deep contact structure 299. In such an embodiment, the deep contact structure 299-1 may couple the first electrode 261 to a voltage source disposed in or on the pixel semiconductor substrate 201 (e.g., a voltage source corresponding to VCAP illustrated in FIG. 1B). In another embodiment, the deep contact structure 299-1 may couple the first electrode 261 to a voltage source disposed in or on the logic semiconductor substrate 291, for example through metal interconnect included in multilayer interconnect structure 288. In other embodiments, the second electrode 265 is notched to form a recess (see, e.g., FIG. 1C-1D) to facilitate access to the first electrode 261 from the front side of the LOFIC semiconductor substrate 251. In such an embodiment, a second interconnect structure may extend from the first electrode 261 to the bonding interface 209 to couple bonding structure 290 (formed by bonding pads MB-1A, MB-1B) connecting the first electrode 261 to the voltage source. In another embodiment, access to the first electrode 261 may be facilitated by etching through the backside of the LOFIC semiconductor substrate 251 to couple the first electrode 261 with an interconnect structure extending from the bonding interface 259 to the first electrode 261.

In the illustrated embodiment of FIG. 2A, the plurality of deep contact vias 271 (e.g., tungsten or copper) included in the stacked semiconductor device 200 are encapsulated in a barrier material 231, which may correspond to the isolation structure 131 illustrated in FIG. 1D of the stacked semiconductor device 100. In some embodiments, the barrier material 231 corresponds to silicon dioxide. The deep contact structure 299 extends beyond the bonding interfaces 209 and 257. In some embodiment, the plurality of deep contact vias 271 is further coupled to one or more bonding connections (e.g., a pair of metal pads embedded in a dielectric layer) formed at the bonding interface 209 disposed between the LOFIC semiconductor substrate 251 and the pixel semiconductor substrate 201. The plurality of deep contact vias 271 further extend to the bonding interface 259 disposed between the LOFIC semiconductor substrate 251 and the logic semiconductor substrate 291. The plurality of deep contact vias 271 further extend through the dielectric layer 287 associated with the backside of the LOFIC semiconductor substrate 251. Accordingly, the illustrated embodiment of the deep contact structure 299-1 includes one or more bonding connections (e.g., bonding pads MB-2A, MB-2B) that the bonding interface 209 and a plurality of deep contact vias 271 extending to the bonding interface 259.

FIG. 2B illustrates a plan view of the stacked semiconductor device 200 including the plurality of fin capacitors 255 laterally surrounded by the plurality of deep contact structures 299, in accordance with an embodiment of the disclosure. More specifically, the plan view illustrated in FIG. 2B of the stacked semiconductor device 200 corresponds to a plan view of the LOFIC semiconductor substrate 251. The plan view shows the plurality of fin capacitors 255 disposed within the central region 238. The central region 238 is laterally surrounded by the peripheral region 239. The peripheral region 239 includes the plurality of deep contact structures 299 arranged around the plurality of fin capacitors 255. The central region 238 of the LOFIC semiconductor substrate 251 having the plurality of fin capacitors 255 may correspond to a pixel cell array region on the pixel semiconductor substrate 201 including a plurality of pixel cells. As discussed previously, the plurality of deep contact structures 299 can be configured to provide interconnections between components disposed on the pixel semiconductor substrate 201 and the logic semiconductor substrate 291.

Figure 3:
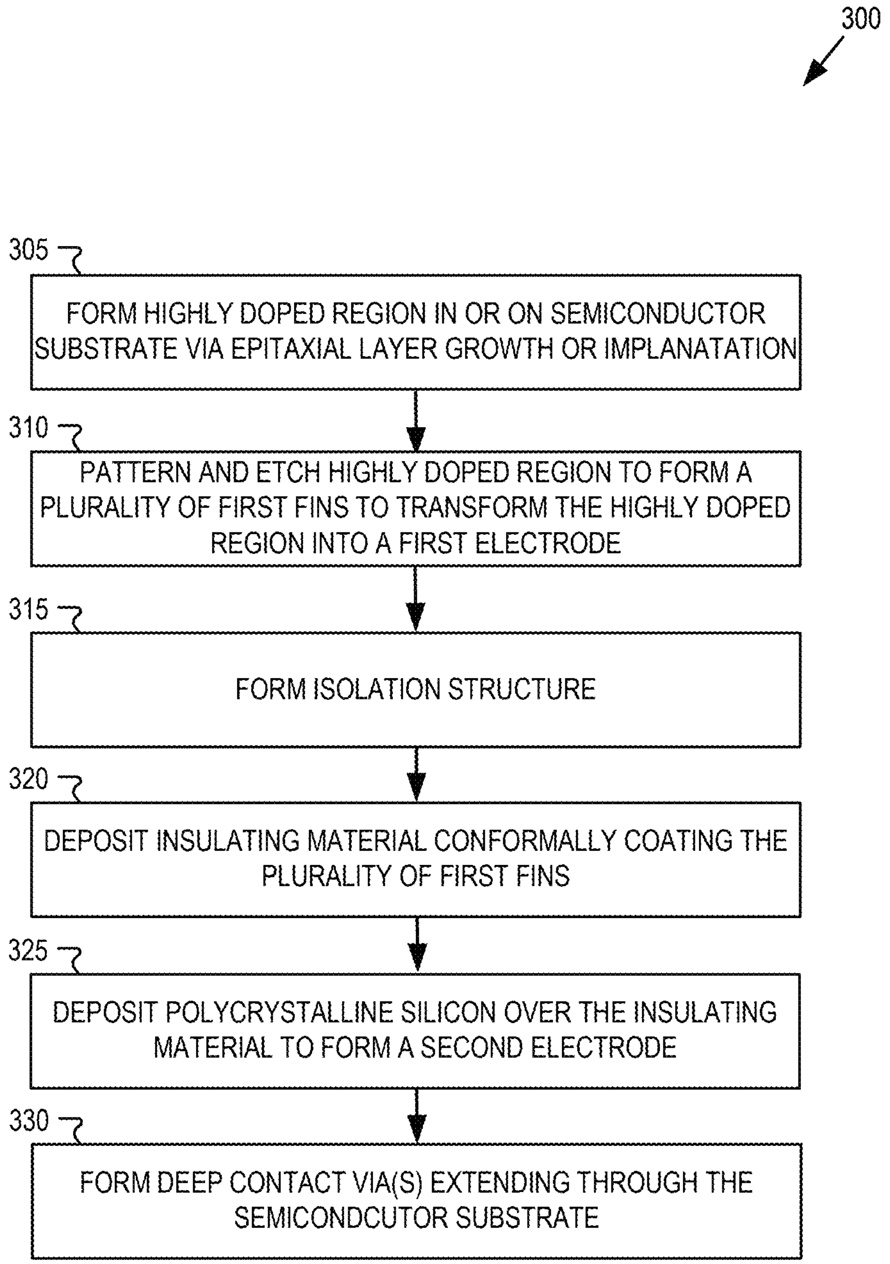
FIG. 3 illustrates an example method for fabricating a fin capacitor included in a stacked semiconductor device, in accordance with embodiments of the disclosure.

FIG. 3 illustrates an example method 300 for fabricating a fin capacitor included in a stacked semiconductor device, in accordance with embodiments of the disclosure. In some embodiments, the example method 300 may be implemented to form the plurality of fin capacitors 155 illustrated in FIG. 1A-1E and/or the plurality of fin capacitors 255 illustrated in FIG. 2A-2B. Accordingly, the example method 300 is one possible process that may be implemented to form the stacked semiconductor device 100 and/or the stacked semiconductor device 200. Fabrication of the stacked semiconductor device 100 and/or the stacked semiconductor device 200 may utilize conventional semiconductor device processing and microfabrication techniques known by one of ordinary skill in the art, which may include, but is not limited to, photolithography, ion implantation, chemical vapor deposition, physical vapor deposition, thermal evaporation, sputter deposition, reactive-ion etching, plasma etching, wafer bonding, chemical mechanical planarization, and the like. It is appreciated that the described techniques are merely demonstrative and not exhaustive and that other techniques may be utilized to fabricate one or more components of various embodiments of the disclosure. It is appreciated that the numbered blocks of the example method 300, including blocks 305-330, may occur in any order and even in parallel. Additionally, blocks may be added to, or removed from, the example method 300 in accordance with the teachings of the present disclosure.

Block 305 shows forming a highly doped region in or on a semiconductor substrate (e.g., the LOFIC semiconductor substrate 151 illustrated in FIG. 1A-1E) via epitaxial layer growth or implantation. For example, the semiconductor substrate may be doped via implantation with dopants of an opposite polarity relative to the semiconductor substrate (e.g., the semiconductor substrate may be a P-type semiconductor while the implanted dopants are N-type) to form the highly doped region with a dopant dosage greater than $10^{14}$ ions/cm$^2$ using one or more implantation energies. In another embodiment, the highly doped region is formed by growing an epitaxial layer on the semiconductor substrate with the appropriate amount of dopants. It is appreciated that the highly doped region may correspond to a doped semiconductor material (e.g., doped silicon).

Block 310 illustrates patterning and etching the highly doped region to form a plurality of first fins to transform the highly doped region into a first electrode of a respective fin capacitor. Portions of the highly doped region are etched and removed to form the plurality of first fins. It is appreciated that the highly doped region is not etched entirely through such that the first electrode includes a first planar portion and the plurality of first fins extending from the first planar portion (e.g., corresponding to the first electrode 161 illustrated in FIG. 1C-1D).

Block 315 shows forming an isolation structure laterally surrounding the first electrode to physically and electrically isolate individual fin capacitors included in the plurality of fin capacitors. The isolation structure is formed by forming a trench extending laterally around the first electrode on the semiconductor substrate. The trench is subsequently filled with at least one isolation material (e.g., silicon dioxide). In some embodiments, the isolation structure is aligned with distal ends of the plurality of first fins of the first electrode included in the fin capacitor (see, e.g., FIG. 1D showing the isolation structure 154 aligned with the distal ends of the plurality of first fins 163 of the first electrode 161 included in the fin capacitor 160). In some embodiments, the isolation structure extends entirely through the first electrode and into the semiconductor substrate (e.g., the LOFIC semiconductor substrate 151 illustrated in FIG. 1D) without extending entirely through the semiconductor substrate (i.e., extends only partially through the semiconductor substrate).

Block 320 illustrates depositing or otherwise growing an insulating material (e.g., silicon dioxide or silicon oxynitride) conformally coating the plurality of first fins of the first electrode (see, e.g., the insulating material 164 illustrated in FIG. 1D-1E). It is appreciated that the insulating material further conformally coats the first planar portion of the first electrode where the plurality of first fins do not extend such that there is a continuous insulating layer extending over the first electrode.

Block 325 shows depositing polycrystalline silicon (i.e., polysilicon) over the first electrode and insulating material conformally coating the first electrode to form a second electrode. The polycrystalline silicon conformally coats the insulating material to fill the space between adjacent fins included in the plurality of first fins to form a plurality of second fins of the second electrode that are nested between the plurality of first fins of the first electrode. The polysilicon deposition continues to such an extent (i.e., thickness greater than the thickness or vertical depth of the plurality of first fins) such that a second planar portion of the second electrode is formed with the plurality of second fins extending from the second planar portion. In some embodiments, each fin capacitor included in the plurality of fin capacitors includes corresponding instances of the first electrode, the second electrode, and the insulating material. In some embodiments, the second planar portion of the second electrode may be patterned and etched to form one or more recesses enabling contacts (e.g., deep contact vias 171 and contact via 174) to form therewithin.

Block 330 illustrates forming one or more deep contact vias extending through the semiconductor substrate. The one or more deep contact vias are formed in some embodiments by forming a pattern over the fin capacitor that has an opening. The fin capacitor may be subsequently etched through the opening to form a trench extending through the fin capacitor and further extending entirely through the semiconductor substrate until reaching a bonding interface (e.g., the bonding interface 109 illustrated in FIG. 1D). In other embodiments, the formation of the fin capacitor includes an inner boundary (e.g., the inner boundary 130 illustrated in FIG. 1C) before the formation of the one or more deep contact vias such that the fin capacitor does not need to be etched. In such an embodiment, the underlying semiconductor substrate may be etched entirely through to form the trench without needing to etch the first electrode, the second electrode, or the insulating material. It is appreciated that the etching step may include one or more steps (e.g., a step to etch the dielectric layer 157 followed by a step to etch the LOFIC semiconductor substrate 151 of FIG. 1D). After forming the trench, a barrier is formed (e.g., corresponding to the isolation structure 131) by coating sidewalls of the trench with an insulating material (e.g., silicon dioxide). Once the barrier is formed, a metal material (e.g., tungsten) or other conductive material(s) may be utilized to fill the trench and form the one or more deep contact vias.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A stacked semiconductor device, comprising:

a plurality of fin capacitors disposed in or on a semiconductor substrate, the plurality of fin capacitors arranged to form a fin capacitor array, wherein a fin capacitor included in the plurality of fin capacitors comprises:

a first electrode including a first planar portion and a plurality of first fins extending from the first planar portion;

a second electrode including a second planar portion and a plurality of second fins extending from the second planar portion, wherein the plurality of first fins is nested with the plurality of second fins such that the plurality of first fins and the plurality of second fins are both disposed between the first planar portion and the second planar portion; and an insulating material disposed between the plurality of first fins and the plurality of second fins.

2. The stacked semiconductor device of claim 1, further comprising an isolation structure disposed in or on the semiconductor substrate and laterally surrounding the fin capacitor, and wherein the second planar portion extends over the isolation structure such that the isolation structure is disposed between the second planar portion and the semiconductor substrate.

3. The stacked semiconductor device of claim 1, wherein the first electrode includes a doped semiconductor material, the doped semiconductor material having a first conductivity type different from a second conductivity type of the semiconductor substrate, and wherein the first electrode is disposed between the semiconductor substrate and the second electrode.

4. The stacked semiconductor device of claim 3, further comprising a deep contact via coupled to the second electrode, wherein the deep contact extends entirely through the semiconductor substrate.

5. The stacked semiconductor device of claim 4, wherein the deep contact via extends through an inner boundary of the fin capacitor such that the deep contact via is laterally surrounded by the first electrode and the second electrode.

6. The stacked semiconductor device of claim 4, wherein the deep contact via extends a vertical depth greater than a combined thickness of the first electrode, the second electrode, and the semiconductor substrate.

7. The stacked semiconductor device of claim 4, wherein the semiconductor substrate corresponds to a first semiconductor substrate, further comprising a second semiconductor substrate including circuitry disposed in or on the second semiconductor substrate, wherein the deep contact via is further coupled to the circuitry.

8. The stacked semiconductor device of claim 7, further comprising a bonding interface disposed between the semiconductor substrate and the second semiconductor substrate, and wherein the deep contact via extends to the bonding interface.

9. The stacked semiconductor device of claim 1, wherein a first lateral area of the first planar portion is less than a second lateral area of the second planar portion, and wherein the second electrode is notched to form a recess.

10. The stacked semiconductor device of claim 9, further comprising a contact via configured to couple a voltage source to the first electrode of the fin capacitor, wherein the contact via is disposed proximate to the recess of the second electrode.

11. The stacked semiconductor device of claim 10, further comprising:

a deep contact via extending through an inner boundary of the fin capacitor such that the deep contact via is laterally surrounded by the first electrode and the second electrode; and a shallow contact via coupled to the second electrode and the deep contact via, wherein the deep contact via, the shallow contact via, and the contact via are arranged such that a first line coincident with the deep contact via and the shallow contact via is perpendicular to a second line coincident with the shallow contact via and the contact via.

12. The stacked semiconductor device of claim 1, further comprising:

a second semiconductor substrate including circuitry disposed in or on the second semiconductor substrate, wherein the second electrode is coupled to the circuitry with a hybrid bond connection at a bonding interface disposed between the semiconductor substrate and the second semiconductor substrate.

13. The stacked semiconductor device of claim 12, wherein the first electrode includes a doped semiconductor material, the doped semiconductor material having a first conductivity type different from a second conductivity type of the semiconductor substrate, and wherein the second electrode is disposed between the second semiconductor substrate and the first electrode.

14. The stacked semiconductor device of claim 1, further comprising a plurality of deep contact vias disposed within a peripheral region of the semiconductor substrate, the peripheral region laterally surrounding the plurality of fin capacitors, wherein the plurality of deep contact vias each extend entirely through the semiconductor substrate.

15. The stacked semiconductor device of claim 1, further comprising a second semiconductor substrate including a plurality of photodiodes arranged to form a pixel cell array, and wherein each pixel cell included in the plurality of pixel cells vertically overlaps with a corresponding fin capacitor included in the plurality of fin capacitors.

16. The stacked semiconductor device of claim 15, wherein the plurality of pixel cells include a pixel cell vertically overlapping the corresponding fin capacitor, wherein the second semiconductor substrate includes pixel cell circuitry, and wherein the fin capacitor is coupled to the pixel cell circuitry with a deep contact via extending entirely through the semiconductor substrate or a hybrid bond connection formed at a bonding interface disposed between the semiconductor substrate and the second semiconductor substrate.

17. The stacked semiconductor device of claim 15, further comprising a third semiconductor substrate including logic circuitry, wherein the semiconductor substrate is disposed between the second semiconductor substrate and the third semiconductor substrate, and wherein the second semiconductor substrate further comprises a deep contact via extending entirely through the semiconductor substrate to couple the logic circuitry of the third semiconductor substrate to pixel cell circuitry included in the semiconductor substrate.

18. The stacked semiconductor device of claim 17, wherein the deep contact via is further coupled to one or more bonding connections formed at a bonding interface disposed between the semiconductor substrate and the second semiconductor substrate, and wherein the deep contact via extends to a second bonding interface disposed between the semiconductor substrate and the third semiconductor substrate.

19. A stacked image sensor, comprising:

a pixel semiconductor substrate including a plurality of photodiodes disposed in or on the pixel semiconductor substrate to form a pixel cell array;

a lateral overflow integration capacitor (LOFIC) semiconductor substrate including a plurality of fin capacitors disposed in or on the LOFIC semiconductor substrate, wherein the pixel semiconductor substrate and the LOFIC semiconductor substrate are vertically stacked such that each pixel cell included in pixel cell array overlaps with a corresponding fin capacitor included in the plurality of fin capacitors, wherein a first fin capacitor included in the plurality of fin capacitors that overlaps a first pixel cell included in the pixel cell array includes:

a first electrode including a first planar portion and a plurality of first fins extending from the first planar portion;

a second electrode including a second planar portion and a plurality of second fins extending from the second planar portion, wherein the plurality of first fins is nested with the plurality of second fins such that the plurality of first fins and the plurality of second fins are both disposed between the first planar portion and the second planar portion; and an insulating material disposed between the plurality of first fins and the plurality of second fins, wherein the first pixel cell includes:

a first photodiode included in the plurality of photodiodes, the first photodiode configured to photogenerate image charge in response to incident light;

a floating diffusion coupled to the first photodiode through a transfer transistor to receive the image charge; and a transistor coupled between the floating diffusion and the first fin capacitor, wherein the first fin capacitor is coupled to receive excess image charge overflow from the first photodiode through the transfer transistor and the transistor.

20. The stacked image sensor of claim 19, further comprising a deep contact via coupled to the second electrode, wherein the deep contact via extends entirely through the LOFIC semiconductor substrate, and wherein the deep contact via further extends through an inner boundary of the first fin capacitor such that the deep contact via is laterally surrounded by the first electrode and the second electrode.

* * * * *